United States Patent
Guarini et al.

(10) Patent No.: US 9,177,787 B2
(45) Date of Patent: Nov. 3, 2015

(54) NH3 CONTAINING PLASMA NITRIDATION OF A LAYER OF A THREE DIMENSIONAL STRUCTURE ON A SUBSTRATE

(71) Applicant: APPLIED MATERIALS, INC., Santa Clara, CA (US)

(72) Inventors: Theresa Kramer Guarini, San Jose, CA (US); Wei Liu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/195,273

(22) Filed: Mar. 3, 2014

(65) Prior Publication Data

US 2014/0273517 A1   Sep. 18, 2014

Related U.S. Application Data

(60) Provisional application No. 61/790,444, filed on Mar. 15, 2013.

(51) Int. Cl.
   *H01L 21/02* (2006.01)
   *C23C 16/56* (2006.01)

(52) U.S. Cl.
   CPC .......... *H01L 21/02269* (2013.01); *C23C 16/56* (2013.01)

(58) Field of Classification Search
   None
   See application file for complete search history.

(56) References Cited

U.S. PATENT DOCUMENTS

| | | | |
|---|---|---|---|
| 2005/0106896 A1 | 5/2005 | Fukuchi | |
| 2011/0017127 A1* | 1/2011 | von Kanel et al. | 117/97 |
| 2011/0281442 A1 | 11/2011 | Bevan et al. | |
| 2012/0115334 A1 | 5/2012 | Takaba | |
| 2013/0012032 A1 | 1/2013 | Liu et al. | |

FOREIGN PATENT DOCUMENTS

JP   2004/335980   11/2004

OTHER PUBLICATIONS

International Search Report and Written Opinion mailed Jun. 25, 2014 for PCT Application No. PCT PCT/US2014/020130.

* cited by examiner

*Primary Examiner* — Scott B Geyer
(74) *Attorney, Agent, or Firm* — Moser Taboada; Alan Taboada

(57) ABSTRACT

Methods and apparatus for forming nitrogen-containing layers are provided herein. In some embodiments, a method includes placing a substrate having a first layer disposed thereon on a substrate support of a process chamber; heating the substrate to a first temperature; and exposing the first layer to an RF plasma formed from a process gas comprising ammonia ($NH_3$) to transform the first layer into a nitrogen-containing layer, wherein the plasma has an ion energy of less than about 8 eV.

12 Claims, 4 Drawing Sheets

NH3 CONTAINING PLASMA NITRIDATION OF A LAYER OF A THREE DIMENSIONAL STRUCTURE ON A SUBSTRATE

CROSS-REFERENCE TO RELATED APPLICATIONS

This application claims benefit of U.S. provisional patent application Ser. No. 61/790,444, filed Mar. 15, 2013, which is herein incorporated by reference in its entirety.

FIELD

Embodiments of the present invention generally relate to semiconductor processing, and more particularly to methods for forming nitrogen-containing layers.

BACKGROUND

The scaling of semiconductor devices, such as dynamic random access memory (DRAM), logic devices, and the like, may be limited by gate leakage ($J_g$). For example, as thickness of a gate dielectric layer is scaled, current may leak between the channel and the gate of a transistor device causing device failure. The gate leakage may be reduced by incorporating nitrogen into the gate dielectric layer. For example, a gate dielectric layer at the 32 nm node may comprise silicon oxynitride (SiON), where the presence of nitrogen reduces gate leakage in the device.

Typically, nitrogen is incorporated into the gate dielectric layer by a plasma nitridation process that provides for gate leakage reduction at the expense of other desired properties, for example, flat band voltage ($V_{fb}$), threshold voltage ($V_t$), and mobility. For example, increased nitrogen content in the gate dielectric layer may undesirably increase $V_t$ and excessively decrease mobility. Further, oxygen may diffuse from the gate dielectric layer under typical processing conditions, thus further reducing device performance, for example by degrading the dielectric properties of the gate dielectric layer.

Furthermore, nitridizing a dielectric layer on a semiconductor wafer for use in a semiconductor structure involves adding nitrogen to a planar semiconductor structure using plasma nitridation or thermal nitridation. However, the use of 3-dimensional ("3D") semiconductor structures, such as a FinFET device or the like, requires a nitridized layer to wrap around the 3D semiconductor structure with the amount of nitrogen incorporated on the top surface of the 3D semiconductor structure substantially equal to the amount of nitrogen incorporated down the sidewalls of the 3D semiconductor structure, referred to herein as conformality. Conformality is calculated as the percentage of nitrogen drop with depth down the sidewall of the 3D semiconductor structure.

One method of forming a nitridized layer is via thermal nitridation using ammonia ($NH_3$). While thermal nitridation using ammonia ($NH_3$) provides suitable conformality, the process fails to provide the desired nitrogen profile at the top surface of the dielectric layer. Another method of forming a nitridized layer is using inductively coupled plasma nitridation with ions formed from nitrogen gas ($N_2$). While this approach provides the desired nitrogen profile in the dielectric film, the resulting conformality is inadequate. While another method, remote plasma nitridation, can provide suitable conformality, the process requires temperatures in excess of about 600 degrees Celsius to about 1000 degrees Celsius, resulting in excessive and undesirable thickening of oxide layers in the gate stack.

Accordingly, the inventors have provided methods of forming nitrogen containing layers having improved conformality.

SUMMARY

Methods and apparatus for forming nitrogen-containing layers are provided herein. In some embodiments, a method includes placing a substrate having a first layer disposed thereon on a substrate support of a process chamber; heating the substrate to a first temperature; and exposing the first layer to an RF plasma formed from a process gas comprising ammonia ($NH_3$) to transform the first layer into a nitrogen-containing layer, wherein the plasma has an ion energy of less than about 8 eV.

In some embodiments, a method of forming a nitrogen-containing layer includes placing a substrate having a first layer disposed thereon on a substrate support of a process chamber, wherein the first layer is a 3-dimensional structure; heating the substrate to a first temperature of about 250 degrees Celsius to about 500 degrees Celsius; and exposing the first layer to an RF plasma formed from a process gas comprising ammonia (NH3) to transform the first layer into the nitrogen-containing layer, wherein the process gas comprises about 0.5% to about 99.5% ammonia (NH3) based on total gas flow and the balance is a noble gas, and wherein the plasma has an ion energy of less than about 8 eV.

The preceding brief summary is not intended to be limiting of the scope of the present invention. Other and further embodiments of the present invention are described below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
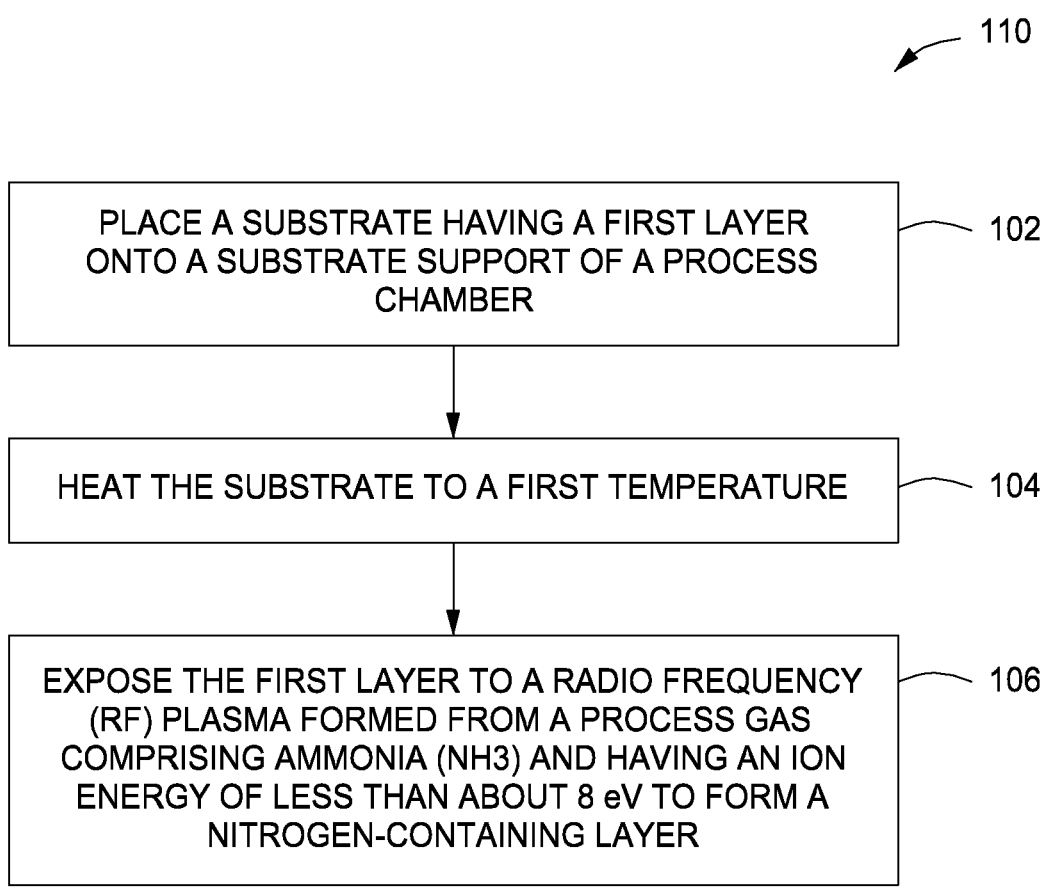
FIG. 1 is a flow chart depicting a method of forming a nitrogen-containing layer in accordance with some embodiments of the invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for forming nitrogen-containing layers are provided herein. The inventive methods and apparatus may advantageously provide improved nitridation of a target layer (e.g., a first layer) for example, by facilitating increased nitrogen content, and improved oxygen retention at an interface between the target layer and another device layer, for example, a polysilicon gate. The inventive methods and apparatus may also advantageously improve the conformally of a nitridized dielectric film atop a 3D semiconductor structure.

FIG. 1 depicts a method 110 for forming a nitrogen-containing layer in accordance with some embodiments of the present invention. Generally, the method 110 includes providing a partially fabricated semiconductor structure including a substrate having a first layer disposed thereon. The semiconductor structure may be a partially fabricated semiconductor device such as Logic, DRAM, or Flash memory devices. The nitrogen-containing layer formed by this process may be one or more of a gate dielectric layer, a tunnel oxide layer, a spacer layer, or any suitable layer of a semiconductor structure that may benefit from nitridation, for example, to reduce junction leakage, gate leakage, or the like.

The method 110 is described herein with respect to the partially fabricated semiconductor structure depicted in FIGS. 2A-D, which respectively depict stages of fabrication of a semiconductor structure including a first layer formed over a substrate. The method 110 may be performed in any suitable plasma reactor that can provide a low energy plasma as disclosed herein, for example, such as those reactors configured to provide an inductively coupled, or remote plasmas, or the like. Embodiments of suitable plasma reactors that may be utilized with the inventive methods are described below with respect to FIG. 3. The plasma reactor may be utilized alone or, more typically, as a processing module of an integrated semiconductor substrate processing system, or cluster tool, such as a CENTURA® DPN Gate Stack integrated semiconductor wafer processing system, available from Applied Materials, Inc. of Santa Clara, Calif. Other tools, including those available from other manufacturers, may also be used.

Figure 2A:
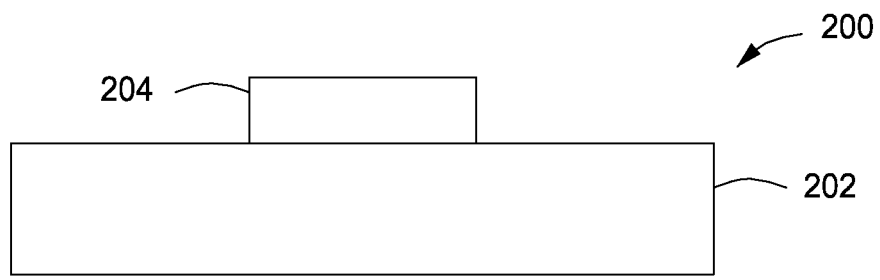
FIGS. 2A-2C depict stages of fabricating a gate dielectric layer in accordance with some embodiments of the invention.
Figure 2B:
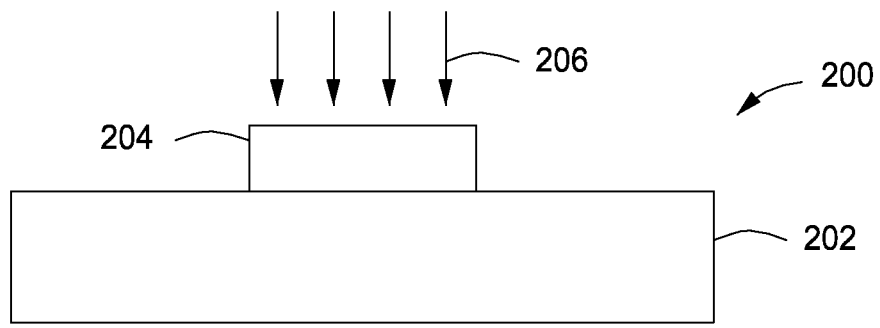

The method 110 begins at 102, where a substrate 202 is provided having a first layer 204 to be nitridized disposed thereon, as shown in FIG. 2A. The substrate 202 and the first layer 204 may be part of a completely or partially fabricated semiconductor device 200. The first layer 204 may be a 3-dimensional, or 3D, structure or a part of such a 3D structure. As used herein a 3-dimensional (or 3D) structure refers to a semiconductor structure where the transistor forms conducting channels on three sides of a vertical structure, as compared to a traditional 2D planar transistor which forms a conducting channel mainly under the gate. The substrate 202 may have various dimensions, such as 200 or 300 mm diameter wafers, as well as rectangular or square panels. The substrate 202 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

The semiconductor device 200 may be completely or partially formed upon the substrate 202 and includes at least the first layer 204 to be nitridized. The semiconductor device 200 (when completed) may be, for example, a field effect transistor (FET), dynamic random access memory (DRAM), a flash memory device, a 3D FINFET device, or the like. The first layer 204 may be, for example, utilized as a gate dielectric layer of a transistor device, a tunnel oxide layer in a flash memory device, a spacer layer atop a gate structure, an inter-poly dielectric (IPD) layer of a flash memory device, or the like. The first layer 204 may have any thickness suitable in accordance with the particular application for which the first layer 204 may be utilized. For example, the first layer 204 may have a thickness of about 0.5 to about 10 nm. The first layer 204 may comprise an oxide layer, such as silicon oxide ($SiO_2$), hafnium oxide ($HfO_2$), hafnium silicate ($HfSiO_x$), or any suitable oxide layer used in a semiconductor device and requiring nitridation. For example, in some embodiments, the oxide layer may be a native oxide layer, or formed by any suitable oxidation process including the oxidation process discussed below. The first layer 204 need not be limited to an oxide layer, and other suitable layers may benefit from the inventive methods disclosed herein. For example, other suitable embodiments of the first layer 204 may include other suitable semiconductor materials, such as silicon (Si), germanium (Ge), silicon germanium (SiGe), silicon carbide (SiC), III-V compounds, or metals, metal nitrides, or metal oxides such as tungsten (W), titanium (Ti), tantalum (Ta), titanium nitride (TiN), tantalum nitride (TaN), titanium oxide ($TiO_2$), or aluminum oxide ($Al_2O_3$), or the like. The first layer 204 can also be a stack of layers, such as a first sub-layer of $SiO_2$ and a second sub-layer of $HfO_2$ or a first sub-layer of $SiO_2$ and a second sub-layer of $HfSiO_x$, or the like.

Next, at 104, the substrate 202 may be heated prior to and during nitridation. Heating the substrate 202 may facilitate providing increased nitrogen content into the first layer 204 and improved device properties. For example, heating the substrate 202 to a temperature of at least about 250 degrees Celsius, or at least about 350 degrees Celsius may facilitate increased nitrogen content (e.g., an atomic percentage content of about 5 to about 35) in the first layer 204. In some embodiments, the substrate may be heated to a temperature of about 250 to about 550 degrees Celsius, or in some embodiments, about 350 to about 450 degrees Celsius. In some embodiments, the substrate may be heated to a temperature of about 400 degrees Celsius. The actual maximum substrate temperature may vary based upon hardware limitations and/or the thermal budget of the substrate being processed.

In embodiments where the first layer 204 is an oxide layer, the increased temperature may advantageously facilitate less evolution of oxygen from the layer (e.g., less than about 20%) and further, accumulation of oxygen at an interface of the first layer 204 and the substrate 202. In some embodiments, the substrate 202 is heated to about 250 to about 550 degrees Celsius. In some embodiments where the first layer 204 is an oxide layer, the substrate 202 may be heated to about 300 to about 550 degrees Celsius, or to about 350 to about 500 degrees Celsius.

In some embodiments, the substrate 202 may be positioned in the reactor such that heat transfer to the substrate is maximized, for example, between the substrate 202 and a substrate support on which the substrate 202 rests during the method 110. As such, the substrate 202 may be secured to the substrate support using a chucking device, such as an electrostatic chuck (ESC), a vacuum chuck, or other suitable device. Chucking the substrate 202 may advantageously facilitate reproducible heat transfer even at low pressures (the process pressure region), for example, at about 4 mTorr to about 1 Torr, or at about 10 to about 80 mTorr, at about 10 to about 40 mTorr, or at about 10 to about 20 mTorr. Optionally, in embodiments where an electrostatic chuck is provided to secure the substrate 202, a second plasma may be formed above the substrate 202 to facilitate stabilization of the substrate temperature as the substrate is chucked. For example, the second plasma may be formed from a non-reactive gas including at least one of argon (Ar), helium (He), krypton (Kr), xenon (Xe), or the like, to preheat the substrate 202 such that upon chucking the substrate 202 to the substrate support and extinguishing the plasma, the substrate 202 does not experience a dramatic change in temperature which could lead to process variation and/or wafer breakage. As used herein, non-reactive gases include gases that do not substantially react with the substrate (e.g., do not substantially deposit upon or etch the substrate).

The substrate 202 may be heated by any suitable heating mechanism capable of increasing and maintaining the substrate temperature at about 250 degrees Celsius or greater or, in some embodiments, at about 350 degrees Celsius or greater. Suitable heating mechanisms can include resistive heating, radiative heating or the like. For example, and as discussed below in embodiments of the reactor 300, one or more resistive heaters may be disposed in a substrate support for providing heat to the substrate 202. Alternatively, the substrate may be heated, for example, by one or more lamps or other energy sources disposed above and/or below the substrate 202.

In one heating approach, the heater elements are embedded in the electrostatic chuck, so that the substrate is directly heated from the electrostatic chuck. Several advantages may arise from such approach: (1) the substrate can be maintained at a constant temperature during the entire process as long as it is chucked, even though the process pressure is as low as 4 mTorr; (2) process results (nitrogen dose and percentage of nitrogen incorporated by mass (N %)) can be reproducible from substrate to substrate due to the tight control on the substrate temperature during the process; and (3) the within-substrate nitridation uniformity pattern can be altered (e.g., compensated for) by carefully designed heating uniformity pattern in the heater elements of the electrostatic chuck, or by providing multi-zone heater elements having independent control.

In the case of using an electrostatic chuck heater, due to the nature of chucking/heating process, the rise of the substrate temperature can be very fast, such as up to about 30 degrees Celsius per second. Under such high heating rates, there may be a chance that not every portion of the wafer will be heated at the same rate, so that at certain point, the temperature difference within the substrate may reach a critical value (e.g., >75 degrees Celsius) which could cause the substrate (such as a semiconductor wafer) to crack. To prevent such failure, a preheat step may be implemented prior to substrate chucking. The preheat step may include flowing a non-reactive gas, such as nitrogen (N2) or helium (He), or the like, at a rate of about 400 sccm to about 4 liter per minute, for about 20 to about 60 seconds or more (such as about 50 seconds), at a pressure of about 1-10 Torr (such as about 8 Torr), while maintaining the electrostatic chuck heater at the desired temperature (such as about 400 degrees Celsius) with the substrate disposed on the surface of the electrostatic chuck but not chucked thereto. The preheat step facilitates bringing up the substrate temperature close to the electrostatic chuck temperature prior to chucking (for example to within about 150 degrees Celsius of a targeted temperature of the substrate), hence reducing the potential thermal shock to the substrate upon chucking the substrate. In some embodiments, when a low contact electrostatic chuck (e.g., an electrostatic chuck having up to about 5% contact area) is utilized to support the substrate, a backside gas may be utilized to preheat the wafer. In some embodiments, the substrate may be preheated prior to delivery into the process chamber, such as by contact or non-contact (e.g., lamp) methods.

Optionally, prior to nitridation of the first layer 204, the process chamber may be pre-conditioned to reduce residual oxygen content in the processing volume. For example, residual oxygen content such as from moisture, water ($H_2O$) or the like may result in undesired parasitic oxidation of the substrate 202 or the first layer 204. To prevent this from happening, the interior of the process chamber (including the lid, sidewall, and pedestal or chuck) may be pre-conditioned with a pre-conditioning plasma formed from a pre-conditioning gas. The pre-conditioning gas may include, for example, nitrogen ($N_2$), ammonia ($NH_3$), or ammonia ($NH_3$) and an inert gas, such as argon (Ar), or any suitable gas and/or combination of gases that may reduce the moisture content and season the chamber interior. In some embodiments, the pre-conditioning gas may consists, or consists essentially of, nitrogen ($N_2$), or ammonia ($NH_3$), or ammonia ($NH_3$) and an inert gas, such as argon (Ar). In some embodiments, pre-conditioning may be performed prior to, or during, chucking (e.g., securing the substrate to the chuck). In some embodiments, pre-conditioning may be performed prior to heating the substrate, or prior to nitridation of the first layer 204.

Figure 2C:
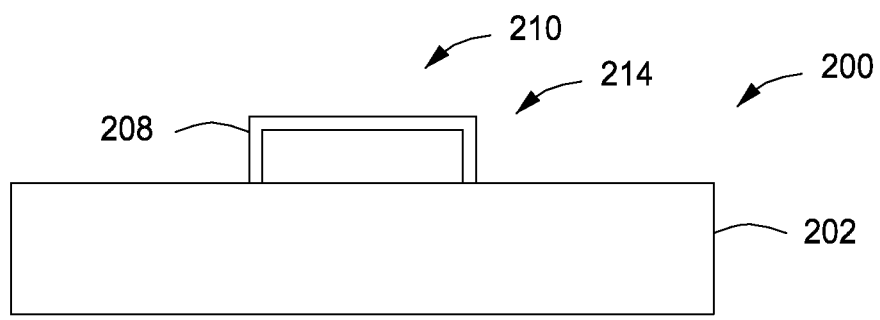

Next, at 106, the first layer 204 may be exposed to a radio frequency (RF) plasma formed from a process gas consisting of, consisting essentially of, or comprising ammonia ($NH_3$). In some embodiments, the first layer 204 may be exposed to the RF plasma, while maintaining the process chamber at a pressure of about 5 mTorr to about 500 mTorr, or about 10 to about 80 mTorr, or about 10 mTorr to about 40 mTorr, or about 10 mTorr to about 20 mTorr to form a nitrogen-containing layer 208, as depicted in FIG. 2C. For example, in some embodiments, the process gas may be pure ammonia ($NH_3$) or a mixture of ammonia ($NH_3$) and a noble gas. The noble gas may be, for example, argon (Ar). In some embodiments, the process gas comprises ammonia ($NH_3$) and argon (Ar). In some embodiments, the process gas may consist only of ammonia and argon. In some embodiments, the process gas may be predominantly comprised of or may consist essentially of ammonia and argon.

In some embodiments, the process gas may be supplied at a total gas flow from about 100 to about 1000 sccm, or at about 400 sccm (although other flow rates may be used depending upon the application and configuration of the process chamber). In some embodiments, the process gas may comprise about 10-100 percent $NH_3$ (e.g., an $NH_3$ flow of between about 10-1000 sccm) with the balance being essentially a noble gas for example, argon (Ar) (e.g., a noble gas percentage of about 0 to about 90 percent). In some embodiments, the process gas may comprise about 0.5-99 percent $NH_3$ (e.g., an $NH_3$ flow of between about 0.5-990 sccm) with the balance being essentially a noble gas, for example, argon (Ar) (e.g., a noble gas percentage of about 1 to about 99.5 percent). In some embodiments, the process gas may be about 1.5-50 percent $NH_3$ (e.g., an $NH_3$ flow of between about 15-500 sccm) with the balance being essentially a noble gas, such as argon (e.g., an inert gas percentage of about 50 to about 98.5 percent). In some embodiments, the process gas may comprise about 10-99 percent of the noble gas (e.g., a noble gas flow of about 100-990 sccm). In some embodiments, the process gas may comprise about 80-99 percent of the noble gas (e.g., a noble gas flow of about 800-990 sccm).

The process gas may be introduced into a plasma reactor, for example, the plasma reactor 300, and used to form a plasma 206. In some embodiments, the plasma density may be about $10^{10}$ to about $10^{12}$ ions/cm$^3$. The plasma 206 may be formed by using an RF source power. In some embodiments, the plasma 206 formed has an ion energy of less than 8 eV. In some embodiments, the plasma 206 formed has an ion energy of less than 4 eV. In some embodiments, the plasma 206 formed has an ion energy of about 1 eV to about 4 eV. In some embodiments, the RF source power is capable of producing up to about 2500 watts, or more. The RF source power may be provided at any suitable RF frequency. For example, in some embodiments, the RF source power may be provided at a frequency about 2 to about 60 MHz, such as 13.56 MHz.

The plasma 206 may be pulsed or continuously applied at up to about 1000 watts effective power. For example, the plasma 206 may applied continuously at up to about 400 watts for a duration of about 10 to about 400 seconds, or about 100 seconds. The duration may be adjusted (e.g., shortened) to limit damage to the semiconductor device 200. Alternatively, the plasma 206 may be pulsed at a pulse frequency of about 4 kHz to about 15 kHz. The pulsed plasma may have a duty cycle of about 2% to about 30%, at up to 2500 watts peak power, where the duty cycle and/or RF source power may be adjusted to limit damage to the semiconductor device 200. In some embodiments, the plasma 206 may be pulsed at a duty cycle of up to 20% at up to 2000 watts peak power. In some embodiments, the plasma 206 may be pulsed at a duty cycle of about 5% to about 10% at up to 2000 watts peak power.

The inventors have observed that the use of a process gas consisting essentially of either ammonia ($NH_3$) or ammonia ($NH_3$) dilute in a noble gas, in a low ion energy plasma 206, for example having an ion energy less than 8 eV, composed of NH* radicals, advantageously more conformally nitridizes the first layer 204, for example a hafnium oxide ($HfO_2$) layer, such that the amount of nitrogen incorporated in the top surface 210 of the nitrogen-containing layer 208 is substantially equal to the amount of nitrogen incorporated down the sidewalls 214 of the nitrogen-containing layer 208.

The use of an ammonia gas ($NH_3$), either pure or dilute in, for example, argon, in forming the low ion energy plasma 206 is advantageous over typical nitridation processes because the NH radicals in the ammonia ($NH_3$)-formed plasma 206 are not affected by the field across the plasma sheath. As a result, the NH radicals arrive at the substrate 202 without any preferred direction and react with substrate surfaces of any orientation, such as the top surface 210 and sidewalls 214 of the first layer 204, in order to conformally nitridize the first layer 204 without undesirable thickening of the first layer 204.

In some embodiments, the exposed surface of the substrate 202 may be at least partially covered with a sacrificial layer (not shown), such as a masking layer to prevent exposure to the plasma 206 (e.g., to limit exposure of the plasma to desired portions of the substrate 202 and/or the first layer 204). In some embodiments, a pressure in the plasma reactor may be up to about 80 mTorr, about 10 mTorr to about 80 mTorr, about 10 mTorr to about 40 mTorr, or about 10 to about 30 mTorr during the exposure of the first layer 204 to the plasma 206.

The nitrogen-containing layer 208 formed from exposure of the first layer 204 to the plasma 206 as discussed above may be, for example, utilized as a gate dielectric layer of a transistor device, a tunnel oxide layer in a flash memory device, a spacer layer atop a gate structure, in an inter-poly dielectric (IPD) layer of a flash memory device, or the like. The nitrogen-containing layer 208 may have a thickness of about 0.3 to about 10 nm. The nitrogen-containing layer 208 may have a nitrogen content of about 3 to about 25 atomic percent. The nitrogen-containing layer 208 may comprise an oxynitride layer, such as silicon oxide (SiON), hafnium oxynitride (HfON), nitrided hafnium silicate (HfSiON), or any suitable oxynitride layer used in a semiconductor device and requiring nitridation. The nitrogen-containing layer 208 need not be limited to an oxynitride layer, and other suitable layers may benefit from the inventive methods disclosed herein. For example, in other suitable embodiments, the nitrogen-containing layer 208 may include or may be replaced with SiCN or other silicon (Si) containing compounds, metal containing compounds such as titanium oxide or nitride, tantalum oxide or nitride, aluminum oxide or nitride, or the like.

Upon forming the nitrogen-containing layer 208, the method 110 generally ends and additional process steps (not shown) may be performed to complete fabrication of the semiconductor device 200 and/or other devices (not shown) on the substrate 202.

Figure 3:
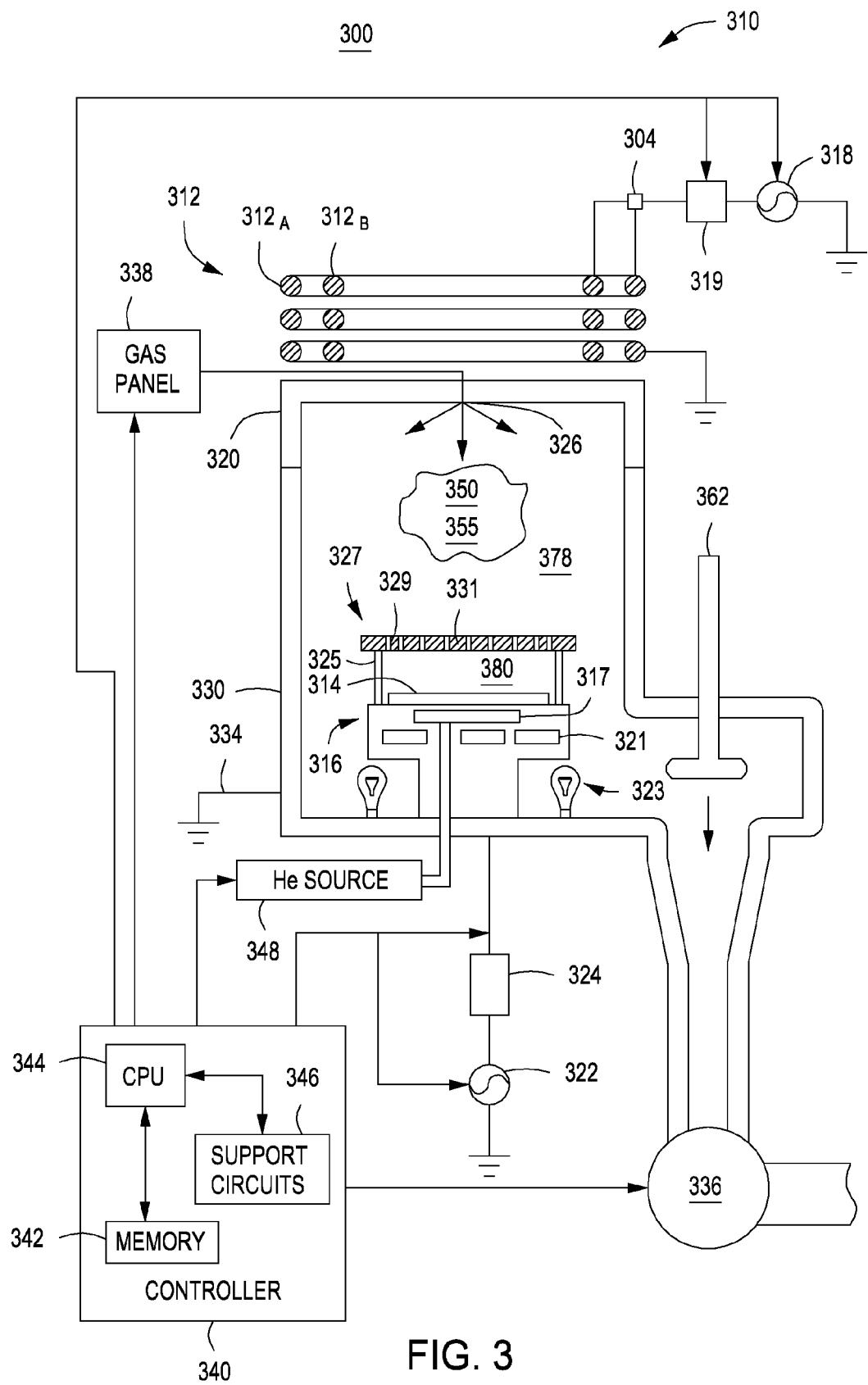
FIG. 3 depicts a plasma nitridation reactor suitable for use in accordance with some embodiments of the invention.

The inventive methods described herein, for example, the method 110 can be performed in a plasma reactor. For example, FIG. 3 depicts a schematic diagram of an inventive plasma reactor 300 adapted to be used to practice embodiments of the invention as discussed herein. The reactor 300 may be utilized alone or, more typically, as a processing module of an integrated semiconductor substrate processing system, or cluster tool, such as a CENTURA® DPN Gate Stack integrated semiconductor wafer processing system, available from Applied Materials, Inc. of Santa Clara, Calif.

The reactor 300 includes a process chamber 310 having a substrate support 316 disposed within a conductive body (wall) 330, and a controller 340. In some embodiments, the substrate support (cathode) 316 is coupled, through a first matching network 324, to a biasing power source 322. The biasing source 322 generally is a source of up to 500 W at a frequency of approximately 13.56 MHz that is capable of producing either continuous or pulsed power. In other embodiments, the source 322 may be a DC or pulsed DC source. In some embodiments, no bias power is provided.

In some embodiments, the process chamber 310 may include a liner (not shown) to line the inner surfaces of the process chamber 310. In some embodiments, the liner may be cooled, for example with coolant channels provided within the liner to flow a coolant therethrough. In some embodiments, the process chamber 310 (and other components exposed to plasma during processing) may be coated with a material that is resistant to the plasma. For example, in some embodiments, the process chamber 310 may be coated with a material that is resistant to attack from the plasma. In some embodiments, the coating may comprise a quartz, or a ceramic material, such as a yttrium oxide ($Y_2O_3$)-based ceramic compositions, aluminum oxide, or the like. In accordance with embodiments of the present invention, attack of chamber components from hydrogen radicals may advantageously be reduced during processing as described herein, while advantageously maintaining nitridation rates.

The chamber 310 may be supplied with a substantially flat dielectric ceiling 320. Other modifications of the chamber 310 may have other types of ceilings such as, for example, a dome-shaped ceiling or other shapes. At least one inductive coil antenna 312 is disposed above the ceiling 320 (dual co-axial antennas 312, including an outer coil $312_A$ and an inner coil $312_B$, are shown in FIG. 3). Each antenna 312 is coupled, through a second matching network 319, to a RF power source 318. The RF source 318 typically is capable of producing up to about 5000 W at a tunable frequency in a range from 2 MHz to 13.56 MHz, and which may produce either a continuous or pulsed plasma. Typically, the wall 330 may be coupled to an electrical ground 334.

In some embodiments, a power divider 304 may be disposed in the line coupling the outer coil $312_A$ and the inner coil $312_B$ to the RF power source 318. The power divider 304 may be utilized to control the amount of RF power provided to each antenna coil (thereby facilitating control of plasma characteristics in zones corresponding to the inner and outer coils). The dual coil antenna configuration may advantageously provide improved control of nitrogen dosage within each zone, such as to the first layer 204, as discussed above in the method 110.

Optionally, either and/or both of the antennas 312 may be tilted and/or raised lowered with respect to the ceiling 320. The change in position and/or angle of the antenna 312 may be utilized, for example, to change the characteristics, such as uniformity, of a plasma formed in the process chamber.

Further, and optionally, a plasma shield/filter may be included above the substrate support to provide improved control of, for example, nitridation of the first layer 204 as discussed above in the method 110. The plasma shield/filter may comprise a material, such as quartz, and may be grounded to the chamber 310 to remove ion species from the plasma formed in the process chamber. For example, an ion-radical shield 327 may be disposed in the chamber 310 above the substrate support 316. The ion-radical shield 327 is electrically isolated from the chamber walls 330 and the substrate support 316 and generally comprises a substantially flat plate 331 having a plurality of apertures 329. In the embodiment depicted in FIG. 3, the ion-radical shield 327 is supported in the chamber 310 above the pedestal by a plurality of legs 325. The apertures 329 define a desired open area in the surface of the ion-radical shield 327 that controls the quantity of ions that pass from a plasma formed in an upper process volume 378 of the process chamber 310 to a lower process volume 380 located between the ion-radical shield 327 and the substrate 314. The greater the open area, the more ions can pass through the ion-radical shield 327. As such, the size and distribution of the apertures 329, along with the thickness of the plate 331 controls the ion density in volume 380. Consequently, the shield 327 is an ion filter. One example of a suitable shield that may be adapted to benefit from the invention is described in U.S. patent application Ser. No. 10/882,084, filed Jun. 30, 2004 by Kumar, et al., and entitled "METHOD AND APPARATUS FOR PHOTOMASK PLASMA ETCHING". By changing the ion density near the wafer surface, one can control the ion/radical ratio, hence, possibly controlling the nitridation profile.

In some embodiments, the substrate support 316 may include a chucking device 317 for securing the substrate 314 to the support pedestal during processing. For example, the chucking device 317 may include an electrostatic chuck or a vacuum chuck. The chucking device 317 may facilitate improved heat transfer between the substrate 314 and one or more resistive heaters 321 disposed in the substrate support 316. As illustrated, the one or more resistive heaters 321 may be disposed in the substrate support 316 generally below the position of substrate 314 and configured in multiple zones to facilitate controlled heating of the substrate 314. In some embodiments, the substrate support 316 includes an electrostatic chuck and also includes one or more resistive heaters disposed within or beneath the electrostatic chuck. In some embodiments, the substrate support 316 may not include an electrostatic chuck, but may have one or more resistive heaters disposed proximate a support surface of the substrate support. In such embodiments, the substrate support having the resistive heaters may have a surface coating of, for example, aluminum nitride (e.g., the substrate support may be fabricated from, or may have an outer coating of, aluminum nitride or the like).

Figure 4:
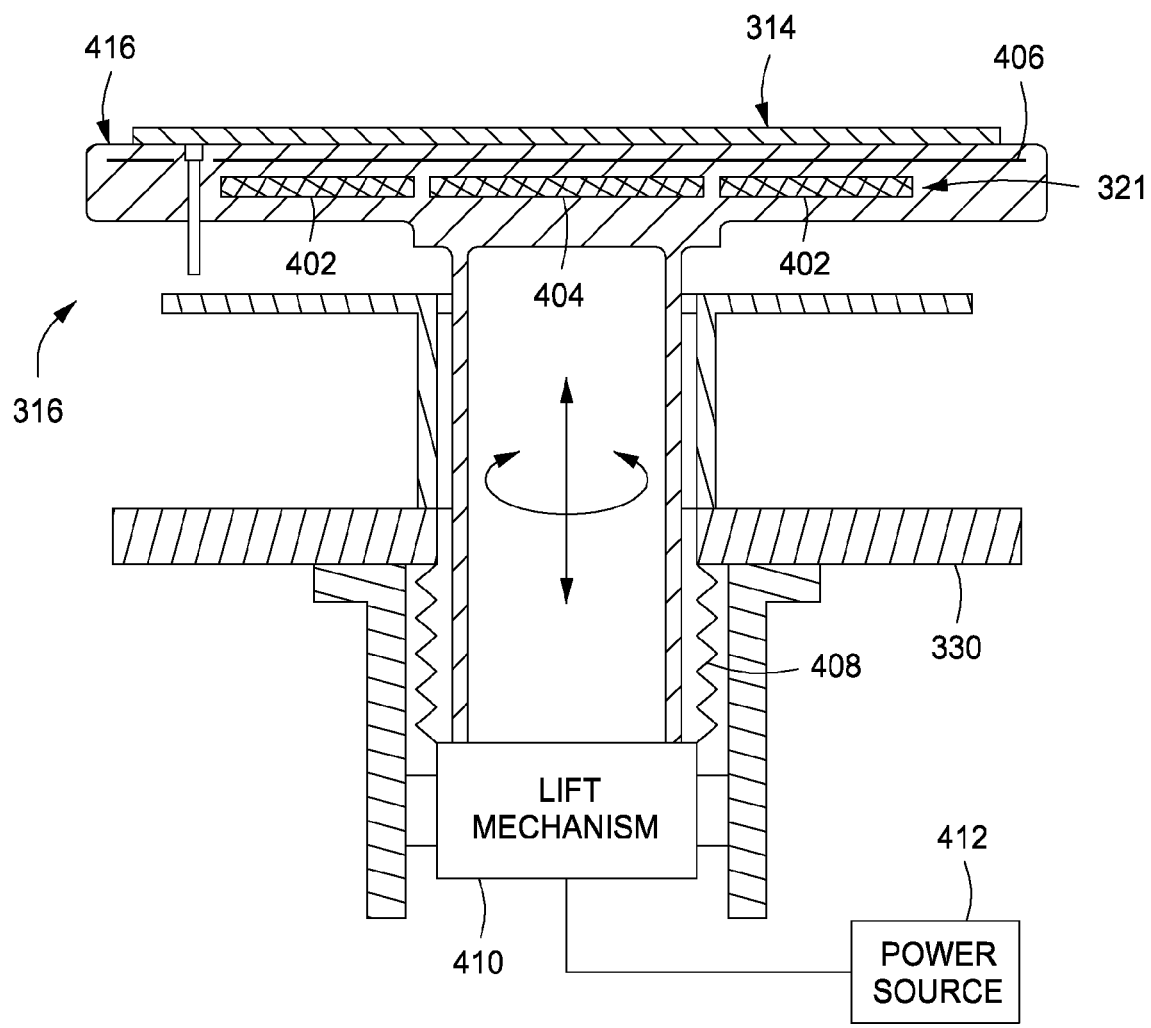
FIG. 4 depicts a substrate support suitable for use in a plasma nitridation reactor in accordance with some embodiments of the invention.

In some embodiments, the substrate support 316 may not have an electrostatic chuck and may include a resistive heater, such as shown in FIG. 4. The substrate support 316 depicted in FIG. 4 includes a resistive heater 321 configured to regulate the temperature of the substrate 314. The heater 321 may be include one or more zones (outer zone 402 and inner zone 404 depicted in FIG. 4). The heater 321 is coupled to a power source 412 and is capable of maintaining the substrate 314 at a temperature of up to about 500 degrees Celsius. In some embodiments a grounding mesh 406 may be disposed between the one or more heaters 321 and an upper surface 416 of the substrate support 316 to prevent the substrate 314 form sticking to the surface 416 of the substrate support 316. The inert coating discussed above may be also applied to the surface 416 of the substrate support 316.

In the case of using an electrostatic chuck with a heater, it has been demonstrated that the nitrogen dose and N % (e.g., the percentage of nitrogen by mass incorporated into the first layer 204 to form the nitrogen-containing layer 208) is directly proportional to the wafer temperature during the plasma process. So to control and/or tune the nitrogen dose and N % uniformity on the wafer, two approaches can be utilized: (1) fixed zone heating with a pre-designed pattern of power density for the heater elements so that the temperature uniformity pattern of the wafer compensates for the plasma uniformity pattern; or (2) tunable multiple zone heating with tunable power supplies for different heater zones (typically center and edge dual zones, but more zones may be utilized) so that the wafer temperature uniformity can be tuned to compensate for the plasma uniformity pattern. In either approach, temperature may be utilized as a knob to achieve improved within-wafer nitridation uniformity and/or providing a desired nitrogen dose pattern in the substrate. In some embodiments, the nitrogen dose pattern may be substantially uniform (e.g., within about 1 percent).

A motion assembly 410 may be provided to control the elevation of the substrate support 316, and therefore, of the substrate 314 during processing. The motion assembly 410 is sealingly coupled to the chamber body 330 using a flexible bellows 408. Alternatively or in combination, the motion assembly 410 may be configured to rotate the substrate support 316.

Returning to FIG. 3, alternatively or in combination, one or more radiative sources, such as lamps 323, may be provided to heat the substrate 314. The lamps 323 may be configured similar to radiative lamps utilized in rapid thermal processing chambers. Other heating methods or designs, including heating the substrate from above, may also be used.

The temperature of the substrate 314 may be controlled by stabilizing a temperature of the substrate support 316. A heat transfer gas from a gas source 348 is provided via a gas conduit 349 to channels formed by the back of the substrate 314 and grooves (not shown) in the support surface and/or chucking device 317. The heat transfer gas is used to facilitate heat transfer between the substrate support 316 and the substrate 314. During the processing, the substrate support 316 may be heated by the one or more resistive heaters 321 to a steady state temperature and then the heat transfer gas facilitates uniform heating of the substrate 314. Using such thermal control, the substrate 314 may be maintained at a temperature of about 0 to about 550 degrees Celsius.

In some embodiments, the substrate support 316 may have a low thermal mass for example, to prevent thermal shock to the substrate die to rapid cooling. For example, the substrate support 316 may be configured without a heat sink or cooling plate coupled thereto, thereby limiting the rate at which heat may be removed from the substrate support 316.

During a typical operation, the substrate 314 (e.g., the substrate 202) may be placed on the substrate support 316 and process gases are supplied from a gas panel 338 through an entry port 326 disposed in the ceiling 320 and centered above the substrate 314. In some embodiments, the gas panel 338 is configured to supply process gases such as ammonia ($NH_3$) or hydrogen ($H_2$). The process gases may be combined with additional gases, for example, nitrogen ($N_2$), helium (He) or argon (Ar) and flowed into the chamber 310 via the entry port 326. The entry port 326 may include, for example, a baffle or similar gas inlet apparatus that can provide a process gas perpendicularly towards the substrate 314 and radially onward into the process chamber 310. Upon entering the process chamber 310 via the entry port 326, the process gases form a gaseous mixture 350. The gaseous mixture 350 is ignited into a plasma 355 in the chamber 310 by applying power from the RF source 318 to the antenna 312. Optionally, power from the bias source 322 may be also provided to the substrate support 316. The pressure within the interior of the chamber 310 is controlled using a throttle valve 362 and a vacuum pump 336. The temperature of the chamber wall 330 is controlled using liquid-containing conduits (not shown) that run through the wall 330.

The controller 340 comprises a central processing unit (CPU) 344, a memory 342, and support circuits 346 for the CPU 344 and facilitates control of the components of the nitridation process chamber 310 and, as such, of nitridation processes, such as discussed herein. The controller 340 may be one of any form of general-purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method may be stored in the memory 342 as software routine and may be executed or invoked in the manner described above. The software routine may also be stored and/or executed by a second CPU (not shown) that is remotely located from the hardware being controlled by the CPU 344.

Thus, methods and apparatus for forming nitrogen-containing layers have been provided herein. The inventive methods and apparatus may advantageously provide improved nitridation of a target layer (e.g., a first layer) by facilitating increased nitrogen content with reduced layer thickening, and improved oxygen retention at an interface between the target layer and another device layer, for example, a polysilicon gate.

While the foregoing is directed to embodiments of the present invention, other and further embodiments of the invention may be devised without departing from the basic scope thereof.

The invention claimed is:

1. A method of forming a nitrogen-containing layer, comprising:
    placing a substrate having a first layer disposed thereon on a substrate support of a process chamber, wherein the first layer is a 3-dimensional structure;
    heating the substrate to a first temperature of about 250 degrees Celsius to about 500 degrees Celsius; and
    exposing the first layer to an RF plasma formed from a process gas comprising ammonia ($NH_3$) to transform the first layer into the nitrogen-containing layer, wherein the process gas comprises about 0.5% to about 99.5% ammonia ($NH_3$) based on total gas flow and the balance is a noble gas, and wherein the plasma has an ion energy of less than about 8 eV, and wherein an amount of nitrogen incorporated in a top surface of the nitrogen-containing layer is substantially equal to an amount of nitrogen incorporated down a sidewall of the nitrogen-containing layer.

2. The method of claim 1, wherein the RF plasma has an ion energy of less than about 4 eV.

3. The method of claim 1, wherein the noble gas is argon.

4. The method of claim 1, wherein the ammonia ($NH_3$) is flowed at about 15 sccm to about 500 sccm.

5. The method of claim 1, further comprising exposing the first layer to the RF plasma while maintaining the process chamber at a pressure of about 5 mTorr to about 500 mTorr.

6. The method of claim 1, further comprising forming the RF plasma using a pulsed RF power source having a frequency of about 13.56 MHz.

7. The method of claim 6, wherein the pulsed RF power source supplies power at up to 2000 watts and at a duty cycle of up to 30%.

8. The method of claim 6, wherein the pulsed RF power source supplies power at a duty cycle of about 5% to about 10%.

9. The method of claim 1, wherein the first layer comprises a semiconductor material, a metal, or a metal oxide.

10. The method of claim 9, wherein the first layer is silicon (Si), germanium (Ge), silicon germanium (SiGe), or a III-V compound.

11. The method of claim 9, wherein the first layer is tungsten (W), titanium (Ti), titanium nitride (TiN), tantalum (Ta), or tantalum nitride (TaN).

12. The method of claim 9, wherein the first layer is titanium dioxide ($TiO_2$), or aluminum oxide ($Al_2O_3$).

* * * * *